United States Patent
Palm et al.

(10) Patent No.: US 10,608,658 B2
(45) Date of Patent: Mar. 31, 2020

(54) PIPELINED ANALOG-TO-DIGITAL CONVERTER (71) Applicant: Telefonaktiebolaget LM Ericsson (publ), Stockholm (SE)

(72) Inventors: Mattias Palm, Bara (SE); Daniele Mastantuono, Lund (SE); Roland Strandberg, Furulund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/313,185

(22) PCT Filed: Jul. 4, 2016

(86) PCT No.: PCT/EP2016/065688
§ 371 (c)(1),
(2) Date: Dec. 26, 2018

(87) PCT Pub. No.: WO2018/006931
PCT Pub. Date: Jan. 11, 2018

(65) Prior Publication Data
US 2019/0158106 A1 May 23, 2019

(51) Int. Cl.
*H03M 1/12* (2006.01)
*H03M 1/16* (2006.01)
(Continued)

(52) U.S. Cl.
CPC .............. *H03M 1/164* (2013.01); *H03M 1/08* (2013.01); *H03M 1/1245* (2013.01); *H03M 1/38* (2013.01)

(58) Field of Classification Search
CPC ...... H03M 1/164; H03M 1/1245; H03M 1/08; H03M 1/38; H03M 1/12
(Continued)

(56) References Cited

U.S. PATENT DOCUMENTS 6,963,300 B1 * 11/2005 Lee ...................... H03M 1/1245
341/162
7,283,083 B1 * 10/2007 Kamal ................. H03M 1/0624
341/160
(Continued)

OTHER PUBLICATIONS

Van Der Goes et al., "A 1.5 mW 68 dB SNDR 80 Ms/s 2 Interleaved Pipelined SAR ADC in 28 nm CMOS", IEEE Journal of Solid-State Circuits, vol. 49, No. 12, Dec. 1, 2014, pp. 2835-2845, IEEE.
(Continued)

*Primary Examiner* — Jean B Jeanglaude
(74) *Attorney, Agent, or Firm* — Coats + Bennett, PLLC (57) ABSTRACT

A pipelined ADC includes a first sub ADC and a second sub ADC. The second sub ADC is configured to receive, as an input, an analog residue generated by the first sub ADC. The first sub ADC is configured to operate in a first conversion phase, generating a digital output of the first sub ADC, and a second conversion phase, generating the analog residue. The first sub ADC includes a reference-voltage generator circuit configured to generate a reference voltage of the first sub ADC and having a first mode of operation and a second mode of operation, in which the noise power of the reference voltage is less than in the first mode of operation. The reference-voltage generator circuit is configured to operate in its first mode of operation in the first conversion phase and in its second mode of operation in the second conversion phase.

20 Claims, 5 Drawing Sheets

(51) Int. Cl.
*H03M 1/38* (2006.01)
*H03M 1/08* (2006.01)

(58) Field of Classification Search
USPC .................................................. 341/155, 161
See application file for complete search history.

(56) References Cited

U.S. PATENT DOCUMENTS

| | | | | |
|---|---|---|---|---|
| 7,592,938 | B2* | 9/2009 | Hsueh | H03M 1/1019 |
| | | | | 341/118 |
| 7,855,671 | B2 | 12/2010 | Dura et al. | |
| 7,907,074 | B2 | 3/2011 | Zanchi et al. | |
| 8,179,293 | B2 | 5/2012 | Chen | |
| 8,344,919 | B2* | 1/2013 | Tseng | H03M 1/1028 |
| | | | | 330/254 |
| 8,427,355 | B2* | 4/2013 | Sin | H03M 1/1225 |
| | | | | 324/658 |
| 8,659,461 | B1* | 2/2014 | Zhu | H03M 1/1019 |
| | | | | 341/155 |
| 8,730,080 | B2* | 5/2014 | Liu | H03M 1/147 |
| | | | | 341/161 |
| 9,219,492 | B1* | 12/2015 | Lok | H03M 1/002 |
| 2014/0132438 | A1* | 5/2014 | Shen | H03M 1/164 |
| | | | | 341/172 |
| 2015/0102952 | A1* | 4/2015 | Yang | H03K 5/2481 |
| | | | | 341/161 |
| 2015/0263751 | A1 | 9/2015 | Sato et al. | |
| 2016/0072518 | A1 | 3/2016 | Francis et al. | |

OTHER PUBLICATIONS

Yang, et al., "A differential reference voltage source and its output buffer used in high-speed high-precision pipelined ADC", 2012 5th International Congress on Image and Signal Processing (CISP 2012), Jan. 1, 2012, pp. 1398-1402.

* cited by examiner

PIPELINED ANALOG-TO-DIGITAL CONVERTER

TECHNICAL FIELD

The present invention relates to a pipelined analog-to-digital converter.

BACKGROUND

An analog-to-digital converter (ADC) is an interface between the analog domain and the digital domain. Several different ADC architectures exist. The successive approximation (SAR) ADC and pipelined ADC architectures can be combined to form an ADC architecture with relatively high conversion rate and relatively high resolution, e.g. with 10 or more effective number of bits (ENOB). A SAR ADC can be implemented using so called charge redistribution with a capacitive array and this scheme also generates a residue, the analog remainder part after conversion to a given number of bits. In a pipelined ADC, this residue is in turn input to a subsequent ADC stage.

Normally, there is an overlap, or redundancy, between the conversion ranges of two subsequent ADC stages in a pipelined ADC. For example, in a two stage pipelined ADC having a first ADC stage (or sub ADC) and a second, subsequent, ADC stage (or sub ADC), there is normally an overlap, between the least significant bit (LSB) of the first ADC stage and the most significant bit (MSB) of the second ADC stage. For example, if the first ADC stage has B1bits and the second ADC stage has B2bits, the total number of bits of the pipelined ADC is B=B1+B2-1, where the term-1is due to the overlap. Implementation of a pipelined SAR ADC is e.g. discussed in F. van der Goes et al., "A 1.5 mW 68 dB SNDR 80 Ms/s 2× Interleaved Pipelined SAR ADC in 28 nm CMOS," in *IEEE Journal of Solid-State Circuits*, vol. 49, no. 12, pp. 2835-2845, December 2014.

SUMMARY

In order to convert an analog value to a digital value in an ADC, an analog reference value is normally used for comparison. For example, a reference voltage generated by a reference voltage generator circuit can be used. The inventors have realized that, in a pipelined ADC, there are differing, and to some extent contradictory, requirements on the reference voltage generator during different phases of the conversion in a sub ADC. In particular, there are differing requirements between a first conversion phase, where the sub ADC generates a digital output of the sub ADC, and a second conversion phase, where the sub ADC generates the analog residue. The inventors have further realized that this can be suitably addressed by using a reference-voltage generator circuit with different modes of operation in the first and second conversion phases. Moreover, the inventors have realized that due to the overlap of conversion ranges between subsequent sub ADCs, it is possible to relax the noise requirements on the reference voltage generation circuit during the first conversion phase, since any error in the LSB of the sub ADC caused by noise in the reference voltage can be corrected in the subsequent sub ADC.

According to a first aspect, there is provided a pipelined ADC comprising a first sub ADC and a second sub ADC. The second sub ADC is configured to receive, as an input, an analog residue generated by the first sub ADC. The first sub ADC is configured to operate in a first conversion phase, in which it generates a digital output of the first sub ADC, and a second conversion phase, in which it generates the analog residue. The first sub ADC comprises a reference-voltage generator circuit configured to generate a reference voltage of the first sub ADC and having a first mode of operation and a second mode of operation, in which the noise power of the reference voltage is less than in the first mode of operation. The reference-voltage generator circuit is configured to operate in its first mode of operation in the first conversion phase and in its second mode of operation in the second conversion phase.

In some embodiments, the reference-voltage generator circuit dissipates less power in the first mode of operation than in the second mode of operation.

The reference voltage generator circuit may be configured to have a first bandwidth in the first mode of operation and a second bandwidth, lower than the first bandwidth, in the second mode of operation.

The reference voltage generator circuit may comprise a switchable filter having said first bandwidth in the first mode of operation and said second bandwidth in the second mode of operation.

In some embodiments, the reference-voltage generator circuit comprises a voltage source and the switchable filter comprises a first resistor connected between an output of the voltage source and a first node, a second resistor connected between the output of the voltage source and a second node, a first capacitor connected between the first node and a signal ground node, a second capacitor connected between the second node and a signal ground node, a first switch connected between the first node and an output node of the reference-voltage generator circuit and configured to connect the first node to the output node of the reference voltage generator circuit in the first mode of operation, and a second switch connected between the second node and the output node of the reference-voltage generator circuit and configured to connect the second node to the output node of the reference voltage generator circuit in the second mode of operation. The second capacitor may have a higher capacitance than the first capacitor.

In some embodiments, the reference-voltage generator circuit comprises a first voltage source and a second voltage source and the switchable filter comprises a first resistor connected between an output of the first voltage source and a first node, a second resistor connected between an output of the second voltage source and a second node, a first capacitor connected between the first node and a signal ground node, a second capacitor connected between the second node and a signal ground node, a first switch connected between the first node and an output node of the reference-voltage generator circuit and configured to connect the first node to the output node of the reference voltage generator circuit in the first mode of operation, and a second switch connected between the second node and the output node of the reference-voltage generator circuit and configured to connect the second node to the output node of the reference voltage generator circuit in the second mode of operation. The second capacitor may have a higher capacitance than the first capacitor.

In some embodiments, the reference-voltage generator circuit comprises a voltage source and the switchable filter comprises a first resistor connected between an output of the voltage source and an output node of the reference voltage generator circuit, a second resistor configured to be switched in in parallel with the first resistor in the first mode of operation, a first capacitor connected between the output node of the reference voltage generator circuit and a signal ground node, and a second capacitor configured to be switched in in parallel with the first capacitor in the second mode of operation.

According to a second aspect, there is provided a method of operating a pipelined ADC comprising a first sub ADC and a second sub ADC. The second sub ADC is configured to receive, as an input, an analog residue generated by the first sub ADC. The first sub ADC is configured to operate in a first conversion phase, in which it generates a digital output of the first sub ADC, and a second conversion phase, in which it generates the analog residue. The first sub ADC comprises a reference-voltage generator circuit configured to generate a reference voltage of the first sub ADC and having a first mode of operation and a second mode of operation, in which the noise power of the reference voltage is less than in the first mode of operation. The method comprises operating the reference-voltage generator circuit in its first mode of operation in the first conversion phase, and operating the reference-voltage generator circuit in its second mode of operation in the second conversion phase.

In some embodiments, the reference-voltage generator circuit dissipates less power in the first mode of operation than in the second mode of operation.

The reference voltage generator circuit may be configured to have a first bandwidth in the first mode of operation and a second bandwidth, lower than the first bandwidth, in the second mode of operation.

The reference voltage generator circuit may comprise a switchable filter having said first bandwidth in the first mode of operation and said second bandwidth in the second mode of operation.

In some embodiments, the reference-voltage generator circuit comprises a voltage source and the switchable filter comprises a first resistor connected between an output of the voltage source and a first node, a second resistor connected between the output of the voltage source and a second node, a first capacitor connected between the first node and a signal ground node, a second capacitor connected between the second node and a signal ground node, and operating the reference voltage generator circuit in its first mode of operation comprises connecting the first node to an output node of the reference voltage generator circuit, and operating the reference voltage generator circuit in its second mode of operation comprises connecting the second node to the output node of the reference voltage generator circuit. The second capacitor may have a higher capacitance than the first capacitor.

In some embodiments, the reference-voltage generator circuit comprises a first voltage source and a second voltage source and the switchable filter comprises a first resistor connected between an output of the first voltage source and a first node, a second resistor connected between an output of the second voltage source and a second node, a first capacitor connected between the first node and a signal ground node, a second capacitor connected between the second node and a signal ground node, and operating the reference voltage generator circuit in its first mode of operation comprises connecting the first node to an output node of the reference voltage generator circuit, and operating the reference voltage generator circuit in its second mode of operation comprises connecting the second node to the output node of the reference voltage generator circuit. The second capacitor may have a higher capacitance than the first capacitor.

In some embodiments, the reference-voltage generator circuit comprises a voltage source and the switchable filter comprises a first resistor connected between an output of the voltage source and an output node of the reference voltage generator circuit, a second resistor, a first capacitor connected between the output node of the reference voltage generator circuit and a signal ground node, and a second capacitor, and operating the reference voltage generator circuit in its first mode of operation comprises switching in the second resistor in parallel with the first resistor, and operating the reference voltage generator circuit in its second mode of operation comprises switching in the second capacitor in parallel with the first capacitor.

According to a third aspect, there is provided an electronic apparatus comprising the pipelined ADC according to any of the claims.

In some embodiments, the electronic apparatus is a radio communication apparatus. It may for instance be a wireless terminal or a radio base station for a cellular communications network.

It should be emphasized that the term "comprises/comprising" when used in this specification is taken to specify the presence of stated features, integers, steps, or components, but does not preclude the presence or addition of one or more other features, integers, steps, components, or groups thereof.

DETAILED DESCRIPTION

Figure 1:
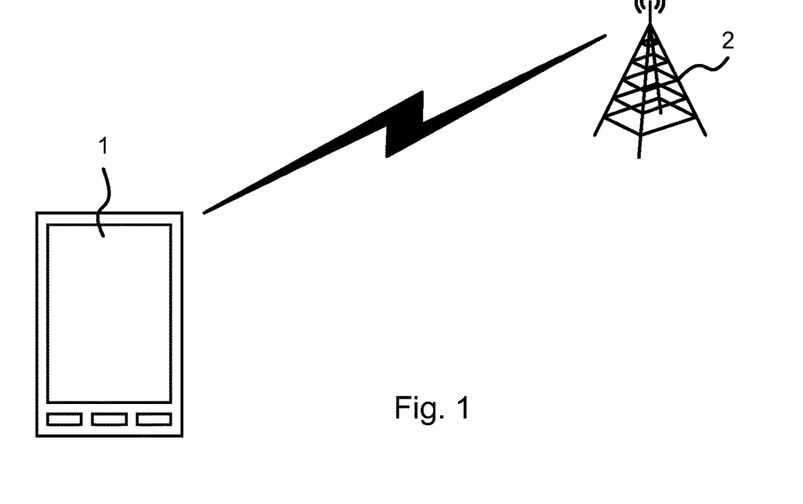
FIG. 1 illustrates a communication environment.

FIG. 1 illustrates a communication environment wherein embodiments of the present invention may be employed. A wireless device 1 of a cellular communications system is in wireless communication with a radio base station 2 of the cellular communications system. The wireless device 1 may be what is generally referred to as a user equipment (UE). The wireless device 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present invention may be applicable in other types of systems as well, such as but not limited to WiFi systems.

The radio base station 2 and wireless device 1 are examples of what in this disclosure is generically referred to as radio communication apparatuses. Embodiments are described below in the context of a radio communication apparatus in the form of the radio base station 2 or wireless device 1. However, other types of radio communication apparatuses can be considered as well, such as a WiFi access point or WiFi enabled device.

It should also be noted that embodiments of ADCs described herein may be used in other electronic apparatuses than radio communication apparatuses as well, wherever a conversion from the analog to the digital domain is needed.

Figure 2:
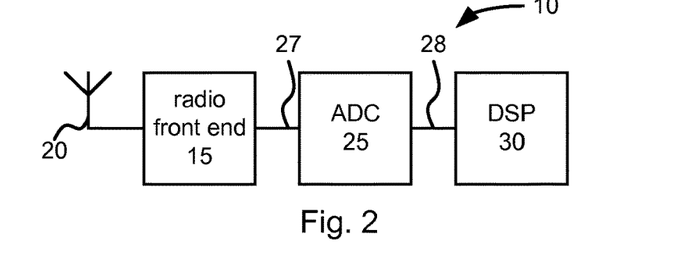
FIGS. 2-3 are block diagrams.

FIG. 2 shows a block diagram of an embodiment of a radio receiver circuit 10, which may e.g. be comprised in a radio communication apparatus, such as the wireless device 1 or radio base station 2. It comprises a radio front-end circuit 15 connected to an antenna 20 for receiving radio-frequency (RF) signals. The radio front-end circuit 15 may e.g. comprise one or more filters, low-noise amplifiers, mixers, etc, for down converting the received RF signals to a lower-frequency signal, such as a baseband signal. The design of such radio front-end circuits are well known and is not discussed in any further detail herein.

In FIG. 2, the radio receiver circuit 10 further comprises a pipelined ADC 25, which is referred to below simply as "the ADC 25" for brevity. The pipelined ADC 25 is configured to receive an analog input signal from the radio front-end circuit on an input 27 and generate a corresponding digital output signal on an output 28.

In FIG. 2, the radio receiver circuit 10 further comprises a digital signal processing (DSP) circuit 30, configured to receive the digital output signal from the ADC 25. The DSP circuit 30 may be configured to process the digital output signal from the ADC 25 to recover received data, e.g. according to methods well known in the art of radio communications, which are not further discussed herein.

Figure 3:
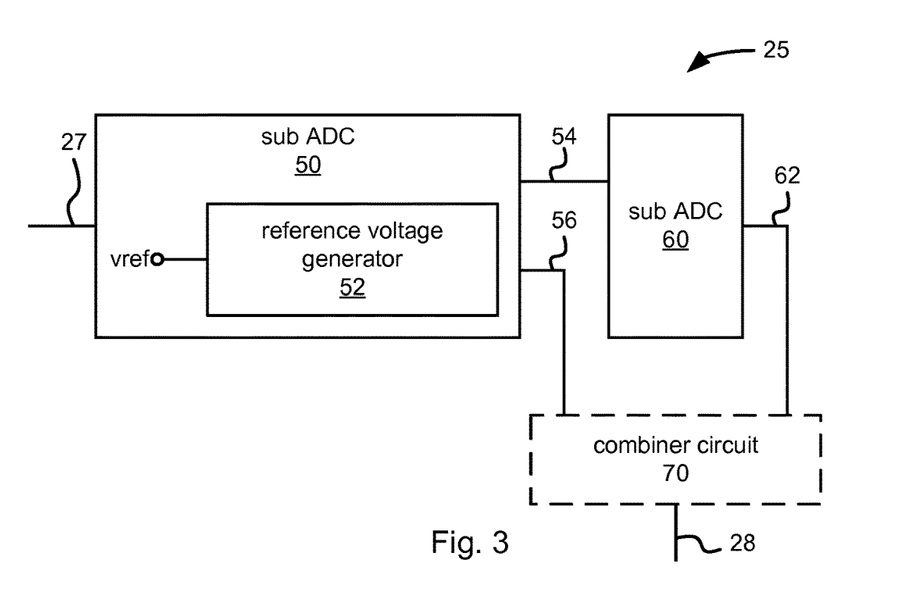

FIG. 3 is a block diagram of the ADC 25 according to an embodiment. It comprises a first sub ADC 50 and a second sub ADC 60. The first sub ADC is configured to receive the analog input signal of the ADC 25 on the input 27. The first and second sub ADCs 50, 60 are connected in a pipelined fashion, wherein the second sub ADC 60 is configured to receive, as an input, an analog residue generated by the first sub ADC 50 on an output 54 of the first sub ADC 50. Sub ADCs, such as 50 and 60, of a pipelined ADC are sometimes referred to as "pipeline stages". FIG. 3 depicts an embodiment with two pipeline stages. However, embodiments with three or more pipeline stages are also possible, as would be readily realized by a person skilled in ADC design. Furthermore, the first sub ADC 50 is illustrated in this disclosure as being the input pipeline stage of the pipelined ADC 25. However, in some embodiments of the pipelined ADC 25 with three or more pipeline stages, the first sub ADC 50 may be an intermediate pipeline stage, i.e. one of the pipeline stages following the input pipeline stage.

According to embodiments, the first sub ADC 50 is configured to operate in a first conversion phase, in which it generates a digital output of the first sub ADC 50 on an output 56 of the first sub ADC, and a second conversion phase, in which it generates the analog residue on the output 54. According to embodiments, the first sub ADC 50 comprises a reference-voltage generator circuit 52 configured to generate a reference voltage vref of the first sub ADC 50.

As indicated in FIG. 3, the pipelined ADC 25 may comprise a combiner circuit 70 configured to combine digital outputs of the first sub ADC 50 and the second sub ADC 60 (and any subsequent sub ADC) to an overall digital output of the ADC 25, e.g. as a weighted sum of the bit values of the digital outputs of the sub ADCs 50, 60, as would be readily understood by a person skilled in the art of ADC design. Alternatively, such a combination may be performed in a subsequent circuit, such as the DSP circuit 30. In that case, the bits of the digital output 28 may be a simple aggregation of the bits of the digital outputs 56 and 62 of the sub ADCs 50 and 60.

Figure 4:
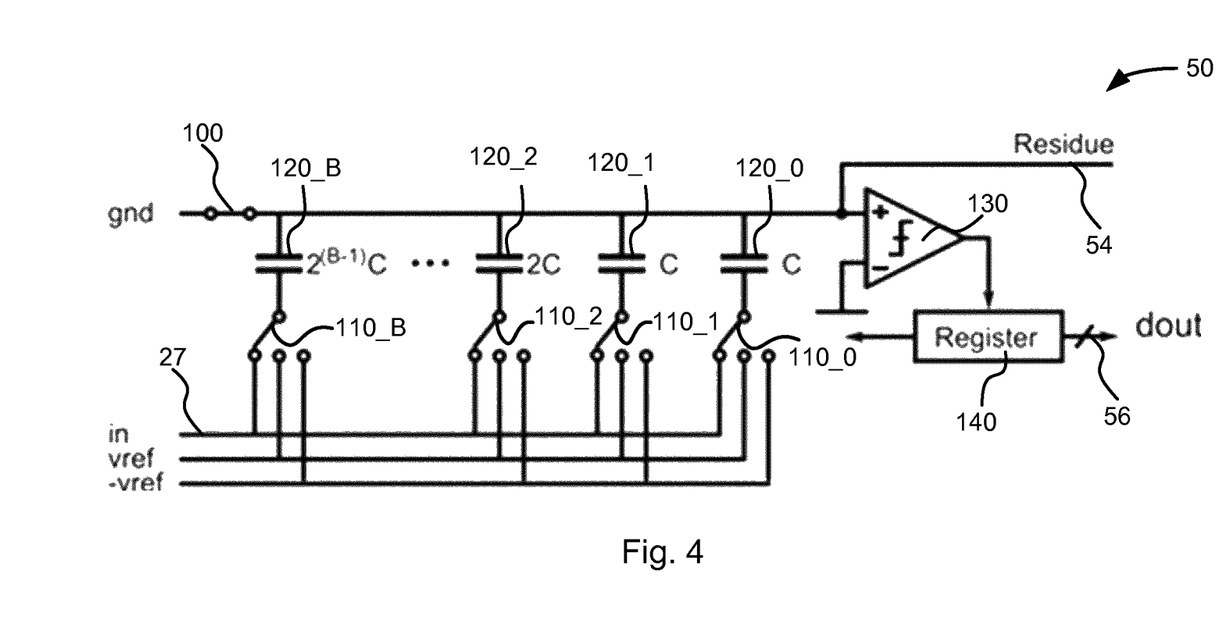
FIG. 4 is a circuit diagram.

In some embodiments, the first sub ADC 50 (as well as the second sub ADC 60 and any further subsequent sub ADC) may be implemented as a SAR ADC, for example a switched-capacitor SAR ADC, as illustrated with a circuit diagram of an embodiment of the first sub ADC 50 in FIG. 4. The principle of operation of a switched-capacitor SAR ADC is well known and only briefly described below. In FIG. 4, the first sub ADC 50 comprises a sampling switch 100, a plurality of switches 110_0-110_B, connected to a set of weighted capacitors 120_0-120_B. Furthermore, in FIG. 4, the first sub ADC 50 comprises a comparator 130 and a successive-approximation register (SAR) 140. During a sampling phase, the sampling switch 100 is closed, whereby a first end of the weighted capacitors 120_0-120_B are connected to signal ground. At the same time, the switches 110_0-110_B are set to connect the other end, or second end, of the weighted capacitors 120_0-120_N to the input 27. Thereby, the weighted capacitors 120_0-120_B are charged with an electrical charge corresponding to the input voltage on the input 27. At the end of the sampling phase, the sampling switch 100 is opened, whereby the capacitors 120_0-120_B are prevented from being discharged, and thus the charge obtained at the weighted capacitors 120_0-120_B at the end of the sampling phase is conserved (until the next sampling phase).

After the sampling phase, the first conversion phase is commenced. During the first conversion phase, a binary search is performed to determine the bits of the digital output of the first sub ADC sequentially in order of significance, starting with the most significant bit (MSB) and ending with the least significant bit (LSB). First it is tested whether the MSB should be '1' or '0' by connecting the switch 110_B to vref. If the comparator outputs a '1', then the MSB should be '1', which is stored in the SAR 140. Similarly, if the comparator outputs a '0', then the MSB should be '0', which is stored in the SAR 140. If the MSB is '1', the switch 110_B is connected to vref during the determination of the bits with lesser significance. If the MSB is '0', the switch 110_B is instead connected to -vref during the determination of the bits with lesser significance. The determination for the bits with lesser significance is done in a similar way. At the end of the first conversion phase, the bit values of the digital output signal of the first sub ADC is stored in the SAR 140, and output on the output 56. The analog residue is then, during the second conversion phase, present at the positive input terminal of the comparator 130, and output to the second sub ADC on the output terminal 54.

Figure 5:
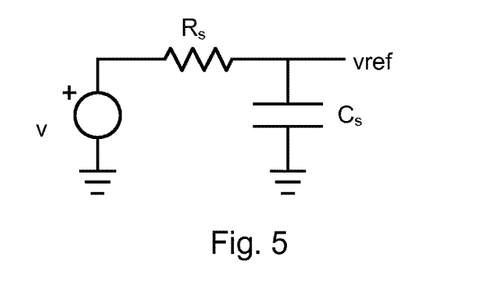
FIG. 5 shows a reference example.

FIG. 5 illustrates a reference example of an implementation of a reference voltage generator circuit that is used for comparisons with embodiments below. It includes a voltage source v and an RC link with a resistor with a resistance $R_s$ and a capacitor with a capacitance $C_s$.

As is further described below, the sub ADC 50 is sensitive to noise, or fluctuations, in the reference voltage vref. Two sources of such noise are:

A voltage ripple is caused by the current pulses flowing through a non-zero impedance of the reference voltage generator circuit. The pulses arise due to charging and discharging the capacitors of the sub ADC bank during the first conversion phase.

Noise from circuit elements, such as thermal noise and flicker noise.

A first way to handle the fluctuations within the reference example of FIG. 5 is to use a capacitor with a very large capacitance $C_s$ and a large time constant $R_sC_s$. This gives a low peak ripple, by reducing and smearing the ripple across the whole sampling period. The ripple during the first conversion phase and the second conversion phase is similar and relatively small. However, this also results in a relatively inefficient use of chip area due to the large capacitor.

Figure 6:
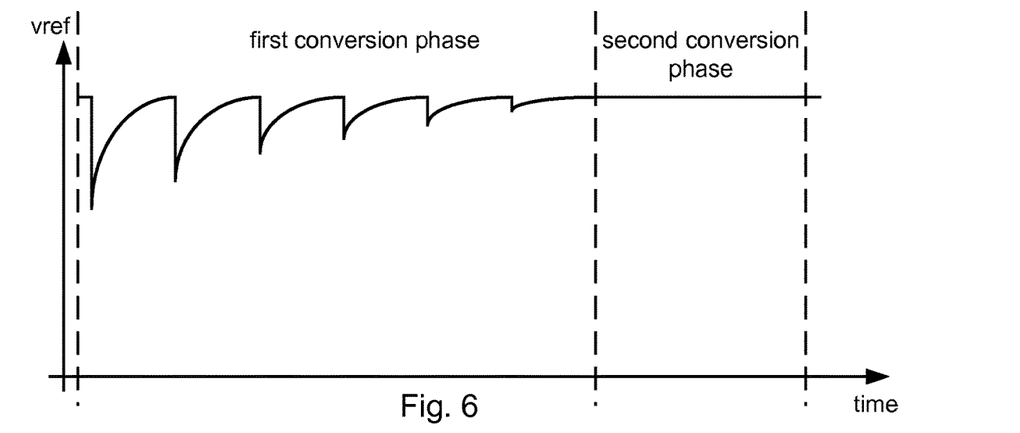
FIGS. 6-7 show plots.

A second way to handle the fluctuations within the reference example of FIG. 5 is to us a relatively large capacitor with a small time constant $R_sC_s$. The capacitor should be selected large enough to sufficiently suppress the ripple during the first conversion phase. The relatively small time constant allows vref to recover before the second conversion phase. Compared with the first way, the second way gives a larger peak ripple during the first conversion phase and smaller peak ripple during the second conversion phase, similar to the plot in FIG. 6. It should be noted that in most implementations, the first conversion phase typically has a duration much longer than the second conversion phase, so the time intervals indicated in FIG. 6 is not necessarily drawn to scale. Furthermore, the second way gives a smaller capacitor (smaller area) than the first way, but poses requirements on the settling speed of the reference voltage generator circuit. Furthermore, the small time constant results in limited filtering (high cutoff frequency) in the RC network for noise originating from the voltage source. The time constant of the RC network should be much smaller than the sampling period $T_s$ to allow the vref to settle, i.e. $R_s C_s \ll T_s$.

As discussed above, noise, or fluctuations, in the reference voltage vref might impact the comparisons made by the comparator 130. Thus, ultimately, such noise might impact the values of the bits of the digital output signal from the first sub ADC 50, and might thus cause an erroneous digital output signal from the first sub ADC 50. However, the error is reflected in the residue that is input to the second sub ADC 60, and as long as this error is within the overlap of the conversion ranges of the first sub ADC 50 and the second sub ADC 60, it is corrected in the second sub ADC 60. Hence, the inventors have realized that a certain amount of noise is tolerable during the first conversion phase. However, when the residue is generated during the second conversion phase, less noise is tolerable, since any fluctuations in the reference voltage during the second conversion phase shows up in the residue and thus causes an error in the input of the second sub ADC 60. Such an error will in turn cause errors in the digital output of the second sub ADC 60, that are not corrected (even if there should be further subsequent sub ADCs in the pipelined ADC 25). The most stringent noise requirements on the reference voltage vref is thus set by the generation of the analog residue. Thus, if a fixed reference voltage generator circuit were to be used, as in the reference example of FIG. 5, the noise levels of that fixed reference voltage generator circuit would have to comply with these most stringent requirements set by the generation of the analog residue.

As discussed above, the pipelined ADC 25 is more tolerant to noise in the reference voltage vref during the first conversion phase of the first sub ADC 50 than in the second conversion phase of the first sub ADC 50. Hence, the inventors have realized that relaxed noise requirements can be applied to the reference voltage generator circuit 52 during the first conversion phase compared with during the second conversion phase. The inventors have further realized that this can be accomplished by having a reference voltage generator circuit with different noise power levels in different modes of operation Therefore, according to embodiments, the reference-voltage generator circuit 52 has a first mode of operation and a second mode of operation. According to embodiments, the noise power of the reference voltage vref is less in the second mode of operation than in the first mode of operation. In embodiments, the reference-voltage generator circuit 52 is configured to operate in its first mode of operation in the first conversion phase and in its second mode of operation in the second conversion phase.

The relaxed noise requirements during the first conversion phase can be exploited in different ways as discussed below.

One way of exploiting the relaxed noise requirements in the first conversion phase is to use a reference-voltage generator circuit 52 that dissipates less power in the first mode of operation than in the second mode of operation. For example, the reference voltage generator circuit 52 can be implemented with a buffer amplifier. For instance, it may be implemented with an operational amplifier (OP) or operational transconductance amplifier (OTA) connected in a feedback configuration, receiving a target reference voltage on an input and generating the reference voltage vref on an output. The noise levels of the reference voltage in such an implementation depends on a DC bias current of the buffer amplifier, such that a higher DC bias current results in a lower noise level and vice versa. Thus, the power dissipation can be reduced in the first mode of operation compared with the second mode of operation by using a lower DC bias current in the first mode than in the second mode.

Figure 7:
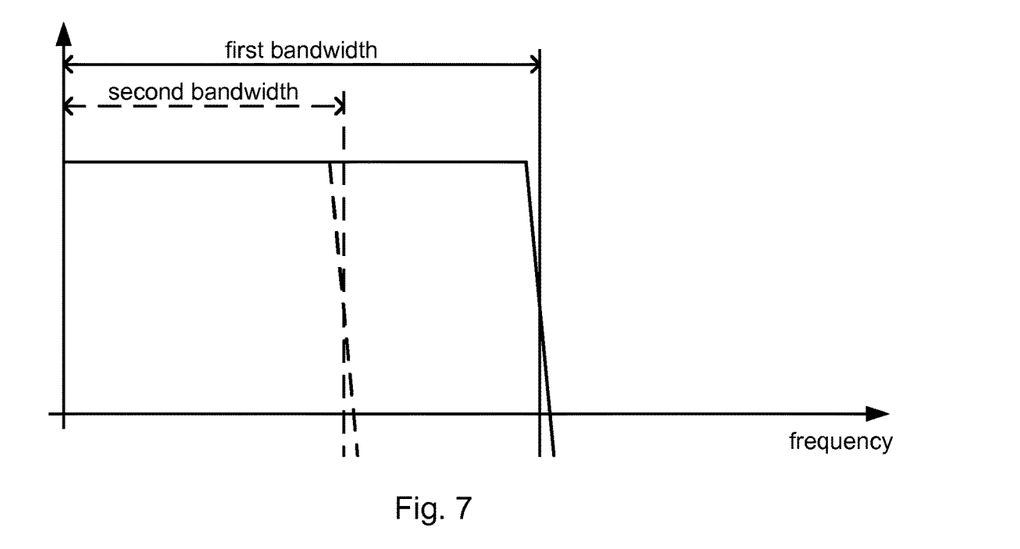

According to some embodiments, the reference voltage generator circuit is configured to have a first bandwidth (or first cut-off frequency) in the first mode of operation and a second bandwidth (or second cutoff frequency) lower than the first bandwidth (or first cut-off frequency), in the second mode of operation. This is illustrated in FIG. 7. Thereby, the settling time constant can be made low enough to enable vref to settle within required bounds at the end of the first conversion phase, such that the voltage ripple has negligible effect on the generation of the analog residue. At the same time, due to the lower bandwidth in the second mode, a better suppression of circuit component noise is obtained compared with the first bandwidth, which reduces the impact of such noise on the generation of the analog residue during the second conversion phase.

Figure 8:
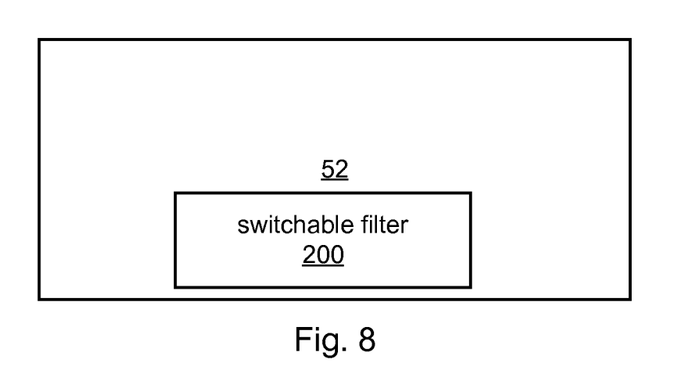
FIG. 8 is a block diagram.

Such a variable bandwidth can be obtained, in accordance with some embodiments, with a switchable filter 200 having said first bandwidth in the first mode of operation and said second bandwidth in the second mode of operation, comprised in the reference voltage generation circuit 50, as illustrated in FIG. 8. Some alternative implementations of the switchable filter 200 are described below with reference to FIGS. 9-11.

According to some embodiments, the following qualitative relations for vref are considered during implementation of the reference voltage generator circuit 52:

First conversion phase: Large fluctuations are tolerated. Large currents are flowing.
Second conversion phase: Small fluctuations are tolerated. Small currents are flowing.

Due to the relatively small currents flowing in the second conversion phase, a relatively high output impedance is tolerable during the second conversion phase, whereas during the first conversion phase, only a more moderate output impedance is tolerated due to the higher currents. Thus, in summary:

First conversion phase: Large noise and moderate impedance is tolerated.
Second conversion phase: Low noise and high impedance is tolerated.

Figure 9:
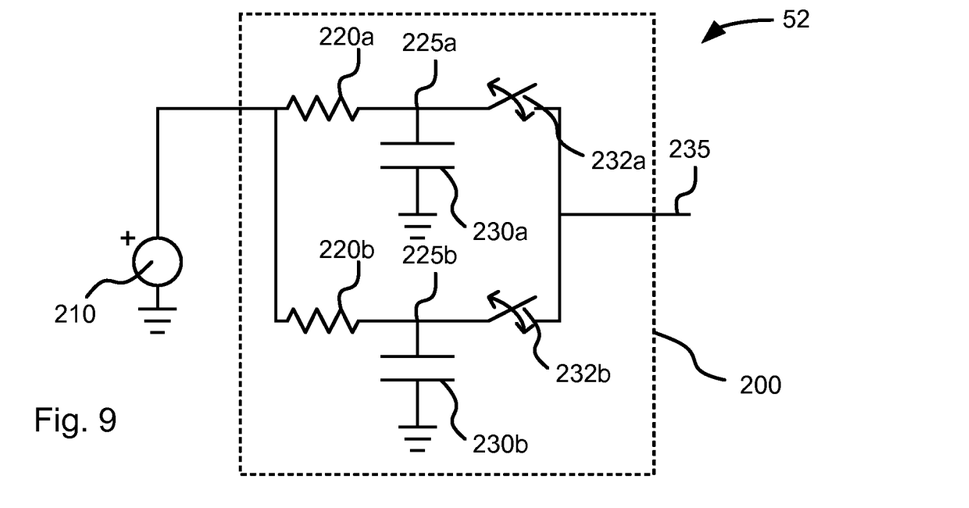
FIGS. 9-11 show circuit diagrams.

In the implementation illustrated in FIG. 9, the reference voltage generation circuit comprises a voltage source 210. The switchable filter 200 comprises a first resistor 220a connected between an output of the voltage source 210 and a first node 225a and a second resistor 220b connected between the output of the voltage source 210 and a second node 225b. Furthermore, the switchable filter 200 comprises a first capacitor 230a connected between the first node 225a and a signal ground node and a second capacitor 230b connected between the second node 225b and a signal ground node (which might be the same or a different signal ground node to which the capacitor 230a is connected). Moreover, the switchable filter 200 comprises a first switch 232a connected between the first node 225a and an output node 235 of the reference-voltage generator circuit 52 and configured to connect the first node 225a to the output node 235 of the reference voltage generator circuit 52 in the first mode of operation. The switchable filter 200 further comprises a second switch 232b connected between the second node 225b and the output node 235 of the reference-voltage generator circuit 52 and configured to connect the second node 225b to the output node 235 of the reference voltage generator circuit 52 in the second mode of operation.

Figure 10:
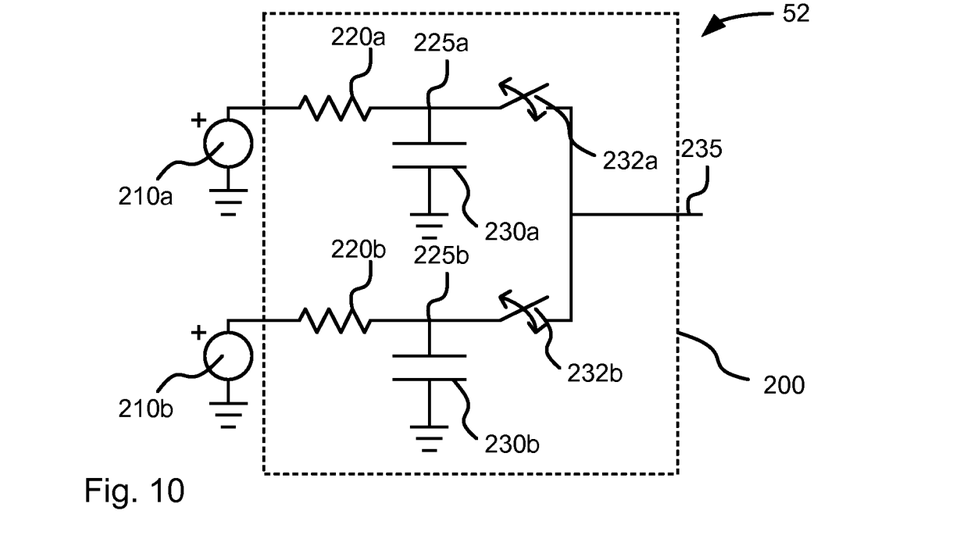

In the implementation illustrated in FIG. 10, the reference-voltage generator circuit 52 comprises a first voltage source 210a and a second voltage source 210b. The switchable filter is similar to the implementation in FIG. 9, and therefore the same reference numerals are used. The switchable filter 200 comprises a first resistor 220a connected between an output of the first voltage source 210a and a first node 225a and a second resistor 220b connected between an output of the second voltage source 210b and a second node 225b. Furthermore, the switchable filter 200 comprises a first capacitor 230a connected between the first node 225a and a signal ground node, and a second capacitor 230b connected between the second node 225b and a signal ground node (which, again, might be the same or a different signal ground node to which the capacitor 230a is connected). Moreover, the switchable filter 200 comprises a first switch 232a connected between the first node 225a and an output node 235 of the reference-voltage generator circuit 52 and configured to connect the first node 225a to the output node 235 of the reference voltage generator circuit 52 in the first mode of operation. The switchable filter 200 further comprises a second switch 232b connected between the second node 225b and the output node 235 of the reference-voltage generator circuit 52 and configured to connect the second node 225b to the output node 235 of the reference voltage generator circuit 52 in the second mode of operation.

Summarizing the operation of the implementations of FIGS. 9 and 10, the first switch 232a is closed in the first mode of operation and open in the second mode of operation, whereas the second switch 232b is closed in the second mode of operation and open in the first mode of operation.

One way of obtaining the above-mentioned lower second bandwidth, compared with the first bandwidth, in the second mode of operation, is to design the second capacitor 230b to have a higher capacitance than the first capacitor 230a. In some embodiments, the second resistor 220b may have the same resistance as the first resistor 220a. In some embodiments, the second resistor 220b may have higher resistance than the first resistor 220a. A slightly lower resistance in the second resistor 220b than in the first resistor 220a would also work, but would require a further increase in the capacitance of the second capacitor 230b.

In FIGS. 9 and 10, the first capacitor 225a is exposed to the ripple occurring during the first conversion. During the second conversion phase, the second capacitor 225b, which has been subject to much less ripple, is used instead. The second capacitor 225b can therefore be considered relatively clean, i.e. providing relatively little ripple and noise during the second conversion phase. Furthermore, a relatively high impedance and large time constant can be used during the second conversion phase, since relatively little current is flowing. The relatively large time constant results in relatively efficient filtering of noise from the voltage source (210 or 210b). This can be exploited, e.g. for achieving a relatively high SNR or, since the noise is efficiently suppressed, to achieve a relatively low power consumption in the voltage source (210 or 210b), by allowing the voltage source to be relatively noisy.

Comparing the implementations of FIG. 9 and FIG. 10, it can be observed that the second voltage source 210b can be designed with relatively low current driving capability compared with the voltage source 210 in FIG. 9 and the first voltage source 210a in FIG. 10.

Figure 11:
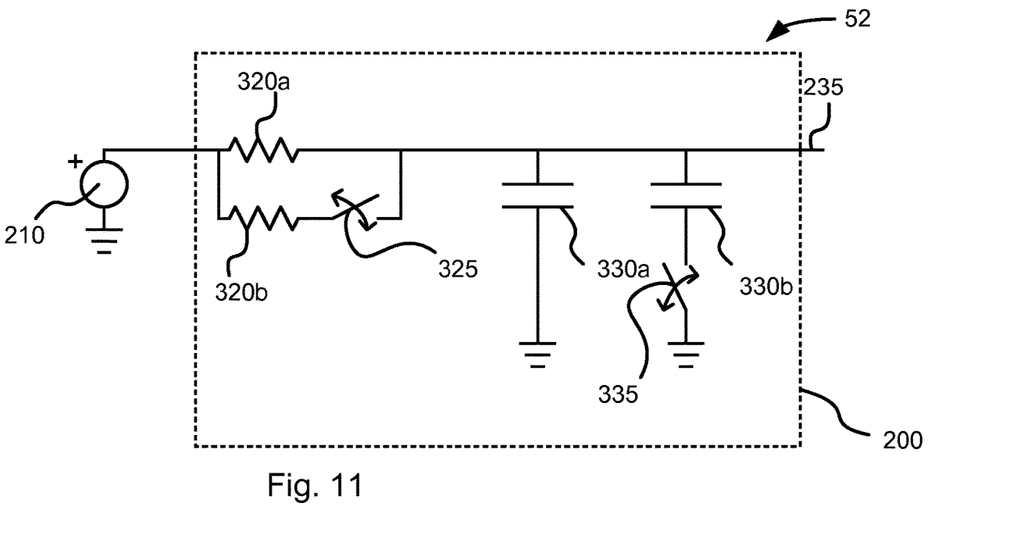

In the implementation illustrated in FIG. 11, the reference-voltage generator circuit 52 comprises a voltage source 210. This is similar to the voltage source 210 in FIG. 9, so the same reference numeral is used for the voltage source. The switchable filter 200 comprises a first resistor 320a connected between an output of the voltage source 210 and the output node 235 of the reference voltage generator circuit. Furthermore, the switchable filter 200 comprises a second resistor 320b configured to be switched in in parallel with the first resistor 320a in the first mode of operation. As illustrated in FIG. 11, this can be accomplished by means of a switch 325, configured to be closed in the first mode of operation and open in the second mode of operation. Moreover, the switchable filter 200 comprises a first capacitor 330a connected between the output node 235 of the reference voltage generator circuit 52 and a signal ground node. It also comprises a second capacitor 330b configured to be switched in in parallel with the first capacitor 330a in the second mode of operation. As illustrated in FIG. 11, this can be accomplished by means of a switch 335, configured to be closed in the second mode of operation and open in the first mode of operation.

It can be observed that any ripple stored on the first capacitor 330a at the end of the first conversion period is shared with the second capacitor 330b when this is switched in. To suppress the ripple, the capacitance of the second capacitor 330b may be selected significantly higher than the capacitance of the first capacitor 330b.

The switches illustrated in FIGS. 9-11, as well as FIG. 4, can be implemented by transistors, such as metal-oxide-semiconductor field-effect transistors (MOSFETs), which are suitable for integration. Voltage sources illustrated in FIGS. 9-11 can be implemented using buffer amplifiers. For instance, similar to what is discussed above, a voltage source can be implemented with an OP or OTA connected in a feedback configuration and configured to receive a target reference voltage on an input.

Figure 12:
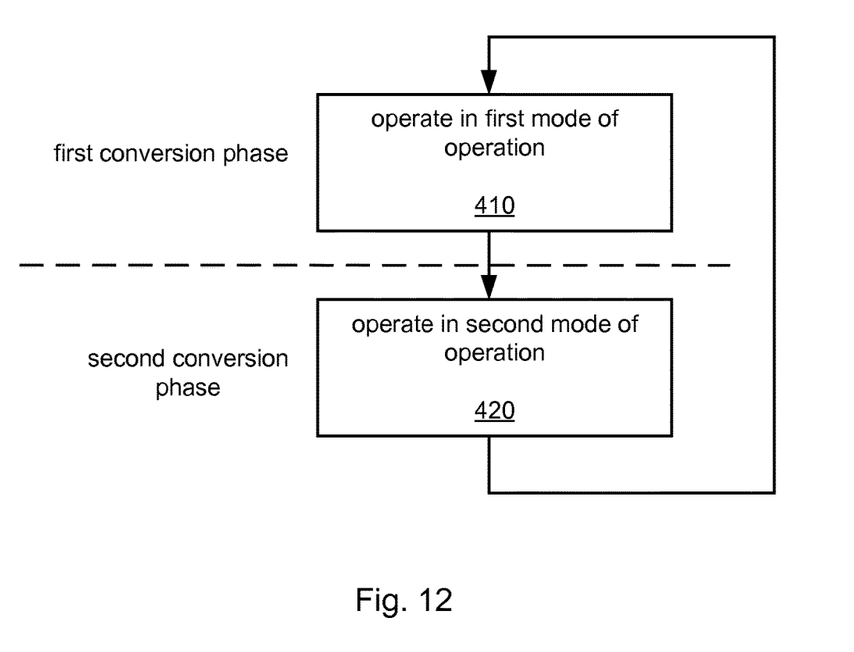
FIG. 12 is a flowchart.

According to some embodiments, there is provided a method of operating the pipelined ADC 25. A flowchart of an embodiment is illustrated in FIG. 12. The method comprises operating 410 the reference-voltage generator circuit 52 in its first mode of operation in the first conversion phase. Furthermore, the method comprises operating 420 the reference-voltage generator circuit 52 in its second mode of operation in the second conversion phase. The method is iterated for each sample period of the pipelined ADC 25, which is illustrated in the flowchart with an arrow back from box 420 to box 410. This is a simplification use for easily illustrating the process. In practice, there is a sampling phase before the first conversion phase, which is omitted in FIG. 12 for simplicity.

With reference to FIGS. 9 and 10, operation 410 may comprise connecting the first node 225a to the output node 235 of the reference voltage generator circuit 52, and operation 420 may comprise connecting the second node 225b to the output node 235 of the reference voltage generator circuit 52.

With reference to FIG. 11, operation 410 may comprises switching in the second resistor 320b in parallel with the first resistor 320a, and operation 420 may comprise switching in the second capacitor 330b in parallel with the first capacitor 330a.

Examples presented above uses RC links to obtain a variable bandwidth for the reference voltage generator circuit 52. However, this can be achieved in other ways as well. For example, the reference voltage generator circuit can be implemented with an amplifier with variable bandwidth.

The present disclosure has been presented above with reference to specific embodiments. However, other embodiments than the above described are possible within the scope of the disclosure. Different method steps than those described above, performing the method by hardware or software, may be provided within the scope of the disclosure. The different features and steps of the embodiments may be combined in other combinations than those described.

The invention claimed is:

1. A pipelined analog-to-digital converter (ADC), comprising:
a first sub ADC; and
a second sub ADC configured to receive, as an input, an analog residue generated by the first sub ADC;
wherein the first sub ADC is configured to operate in:
a first conversion phase in which it generates a digital output of the first sub ADC; and
a second conversion phase in which it generates the analog residue;
wherein the first sub ADC comprises a reference-voltage generator circuit:
configured to generate a reference voltage of the first sub ADC;
having a first mode of operation;
having a second mode of operation in which a noise power of the reference voltage is less than in the first mode of operation; and
configured to operate in its first mode of operation in the first conversion phase and in its second mode of operation in the second conversion phase.

2. The pipelined ADC of claim 1, wherein the reference-voltage generator circuit dissipates less power in the first mode of operation than in the second mode of operation.

3. The pipelined ADC of claim 1, wherein the reference voltage generator circuit is configured to have a first bandwidth in the first mode of operation and a second bandwidth, lower than the first bandwidth, in the second mode of operation.

4. The pipelined ADC of claim 3, wherein the reference voltage generator circuit comprises a switchable filter having the first bandwidth in the first mode of operation and the second bandwidth in the second mode of operation.

5. The pipelined ADC of claim 4:
wherein the reference-voltage generator circuit comprises a voltage source; and
wherein the switchable filter comprises:
a first resistor connected between an output of the voltage source and a first node;
a second resistor connected between the output of the voltage source and a second node;
a first capacitor connected between the first node and a signal ground node;
a second capacitor connected between the second node and a signal ground node;
a first switch connected between the first node and an output node of the reference-voltage generator circuit and configured to connect the first node to the output node of the reference voltage generator circuit in the first mode of operation; and
a second switch connected between the second node and the output node of the reference-voltage generator circuit and configured to connect the second node to the output node of the reference voltage generator circuit in the second mode of operation.

6. The pipelined ADC of claim 5, wherein the second capacitor has a higher capacitance than the first capacitor.

7. The pipelined ADC of claim 4:
wherein the reference-voltage generator circuit comprises a first voltage source and a second voltage source; and
wherein the switchable filter comprises:
a first resistor connected between an output of the first voltage source and a first node;
a second resistor connected between an output of the second voltage source and a second node;
a first capacitor connected between the first node and a signal ground node;
a second capacitor connected between the second node and a signal ground node;
a first switch connected between the first node and an output node of the reference-voltage generator circuit and configured to connect the first node to the output node of the reference voltage generator circuit in the first mode of operation; and
a second switch connected between the second node and the output node of the reference-voltage generator circuit and configured to connect the second node to the output node of the reference voltage generator circuit in the second mode of operation.

8. The pipelined ADC of claim 4:
wherein the reference-voltage generator circuit comprises a voltage source; and
wherein the switchable filter comprises:
a first resistor connected between an output of the voltage source and an output node of the reference voltage generator circuit;
a second resistor configured to be switched in parallel with the first resistor in the first mode of operation;
a first capacitor connected between the output node of the reference voltage generator circuit and a signal ground node; and
a second capacitor configured to be switched in in parallel with the first capacitor in the second mode of operation.

9. A method of operating a pipelined analog-to-digital converter (ADC); the pipelined ADC comprising a first sub ADC and a second sub ADC; wherein the second sub ADC is configured to receive, as an input, an analog residue generated by the first sub ADC; wherein the first sub ADC is configured to operate in 1) a first conversion phase in which it generates a digital output of the first sub ADC, and 2) a second conversion phase in which it generates the analog residue; wherein the first sub ADC comprises a reference-voltage generator circuit configured to generate a reference voltage of the first sub ADC; wherein the reference-voltage generator circuit has a first mode of operation and a second mode of operation; wherein a noise power of the reference voltage is less in the second mode of operation than in the first mode of operation; the method comprising:
operating the reference-voltage generator circuit in its first mode of operation in the first conversion phase; and
operating the reference-voltage generator circuit in its second mode of operation in the second conversion phase.

10. The method of claim 9, wherein the reference-voltage generator circuit dissipates less power in the first mode of operation than in the second mode of operation.

11. The method of claim 9, wherein the reference voltage generator circuit is configured to have a first bandwidth in the first mode of operation and a second bandwidth, lower than the first bandwidth, in the second mode of operation.

12. The method of claim 11, wherein the reference voltage generator circuit comprises a switchable filter having the first bandwidth in the first mode of operation and the second bandwidth in the second mode of operation.

13. The method of claim 12:
wherein the reference-voltage generator circuit comprises a voltage source;
wherein the switchable filter comprises:
 a first resistor connected between an output of the voltage source and a first node;
 a second resistor connected between the output of the voltage source and a second node;
 a first capacitor connected between the first node and a signal ground node; and
 a second capacitor connected between the second node and a signal ground node;
wherein operating the reference voltage generator circuit in its first mode of operation comprises connecting the first node to an output node of the reference voltage generator circuit; and
wherein operating the reference voltage generator circuit in its second mode of operation comprises connecting the second node to the output node of the reference voltage generator circuit.

14. The method of claim 13, wherein the second capacitor has a higher capacitance than the first capacitor.

15. The method of claim 12:
wherein the reference-voltage generator circuit comprises a first voltage source and a second voltage source;
wherein the switchable filter comprises:
 a first resistor connected between an output of the first voltage source and a first node;
 a second resistor connected between an output of the second voltage source and a second node;
 a first capacitor connected between the first node and a signal ground node; and
 a second capacitor connected between the second node and a signal ground node;
wherein operating the reference voltage generator circuit in its first mode of operation comprises connecting the first node to an output node of the reference voltage generator circuit; and
wherein operating the reference voltage generator circuit in its second mode of operation comprises connecting the second node to the output node of the reference voltage generator circuit.

16. The method of claim 12:
wherein the reference-voltage generator circuit comprises a voltage source;
wherein the switchable filter comprises:
 a first resistor connected between an output of the voltage source and an output node of the reference voltage generator circuit;
 a second resistor;
 a first capacitor connected between the output node of the reference voltage generator circuit and a signal ground node; and
 a second capacitor;
wherein operating the reference voltage generator circuit in its first mode of operation comprises switching in the second resistor in parallel with the first resistor; and
wherein operating the reference voltage generator circuit in its second mode of operation comprises switching in the second capacitor in parallel with the first capacitor.

17. An electronic apparatus, comprising:
a pipelined ADC, the pipelined ADC comprising:
 a first sub ADC; and
 a second sub ADC configured to receive, as an input, an analog residue generated by the first sub ADC;
 wherein the first sub ADC is configured to operate in:
  a first conversion phase in which it generates a digital output of the first sub ADC; and
  a second conversion phase in which it generates the analog residue;
 wherein the first sub ADC comprises a reference-voltage generator circuit:
  configured to generate a reference voltage of the first sub ADC;
  having a first mode of operation;
  having a second mode of operation in which a noise power of the reference voltage is less than in the first mode of operation; and
  configured to operate in its first mode of operation in the first conversion phase and in its second mode of operation in the second conversion phase.

18. The electronic apparatus of claim 17, wherein the electronic apparatus is a radio communication apparatus.

19. The electronic apparatus of claim 18, wherein the electronic apparatus is a wireless terminal for a cellular communications network.

20. The electronic apparatus of claim 18, wherein the electronic apparatus is a radio base station for a cellular communications network.

* * * * *